(12) United States Patent
Xiong et al.

(10) Patent No.: US 8,736,038 B2
(45) Date of Patent: May 27, 2014

(54) LEAD FRAME HAVING INCREASED STABILITY DUE TO REINFORCED DIE PADS AND PACKAGING METHOD USING SUCH LEAD FRAME

(75) Inventors: Hui Jun Xiong, Shenzhen (CN); Pierangelo Magni, Villasanta (IT)

(73) Assignees: STMicroelectronics S.r.l., Agrate Brianza (MB) (IT); STMicroelectronics (Shenzhen) Manufacturing Co., Ltd., Shenzhen (CN)

( * ) Notice: Subject to any disclaimer, the term of this patent is extended or adjusted under 35 U.S.C. 154(b) by 0 days.

(21) Appl. No.: 13/615,185

(22) Filed: Sep. 13, 2012

(65) Prior Publication Data

US 2013/0075885 A1 Mar. 28, 2013

(30) Foreign Application Priority Data

Sep. 27, 2011 (CN) .......................... 2011 1 0304978

(51) Int. Cl.
*H01L 23/495* (2006.01)
*H01L 23/48* (2006.01)
*H01L 21/44* (2006.01)
*H01L 21/48* (2006.01)
*H01L 21/50* (2006.01)

(52) U.S. Cl.
USPC ........................... 257/676; 257/693; 438/123

(58) Field of Classification Search
USPC ......... 257/676, 674, 731, 691–693, 773, 784; 438/123, 617, 618, 666
See application file for complete search history.

(56) References Cited

U.S. PATENT DOCUMENTS 8,283,212 B2* 10/2012 Xue et al. ...................... 438/123
2003/0102537 A1* 6/2003 McLellan et al. ............. 257/666

* cited by examiner

*Primary Examiner* — Matthew Reames
*Assistant Examiner* — Dilinh Nguyen
(74) *Attorney, Agent, or Firm* — Wolf, Greenfield & Sacks, P.C.

(57) ABSTRACT

There is provided a lead frame and a packaging method. The lead frame comprises a first plurality of die pads, a second plurality of leads extending from the first plurality of die pads, and a third plurality of tie elements, each of which connects one of the first plurality of die pads to another.

12 Claims, 3 Drawing Sheets

LEAD FRAME HAVING INCREASED STABILITY DUE TO REINFORCED DIE PADS AND PACKAGING METHOD USING SUCH LEAD FRAME

CROSS REFERENCE TO RELATED APPLICATIONS

This application claims the priority benefit of Chinese patent application number 201110304978.3, filed on Sep. 27, 2011, entitled "Lead Frame and Packaging Method", which is hereby incorporated by reference to the maximum extent allowable by law.

TECHNICAL FIELD

This invention relates generally to semiconductor packaging, and more particularly to lead frames.

BACKGROUND

Lead frame, also known as leadframe, is used in IC package for providing mechanical support to a die during its assembly into a finished product. A lead frame typically comprises a die pad, to which the die is attached, and leads, which serve as the means for electrically connecting the die to the outside world such as a printed circuit board. The die is connected to the leads by wires through wire bonding or by tape automated bonds.

However, as shown in FIG. 1, there may occur a case where the die pad 1 with the die 2 attached thereon loses proper orientation due to a force exerted on the die pad during transferring the lead frame from one apparatus to another apparatus, or during other operations. As a result, the die pad 1 must be reoriented with the expenditure of great operator time and effort. Moreover, the wires 3 between the leads 4 and the die 2 are susceptible to damage when stretched as shown in FIG. 1, which leads to electrical connection failure and decrease the yield of package.

Thus, there is a need for a lead frame that is less susceptible to disorientation or deformation.

SUMMARY

In one aspect, there is provided a lead frame, comprising: a first plurality of die pads; a second plurality of leads extending from the first plurality of die pads; and a third plurality of tie elements, each of which connects one of the first plurality of die pads to another.

In another aspect, there is provided a method, comprising: providing a lead frame having a first plurality of die pads, a second plurality of leads extending from the first plurality of die pads, and a third plurality of tie elements, each of which connects one of the first plurality of die pads to another; attaching a first plurality of dice to the first plurality of die pads respectively; attaching at least a wire bond between each of the first plurality of dice and the corresponding die pad respectively; molding the first plurality of dice; and cutting off the third plurality of tie elements.

The foregoing has outlined, rather broadly, features of the present disclosure. Additional features of the disclosure will be described, hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of embodiments of the present disclosure and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

Figure 1:
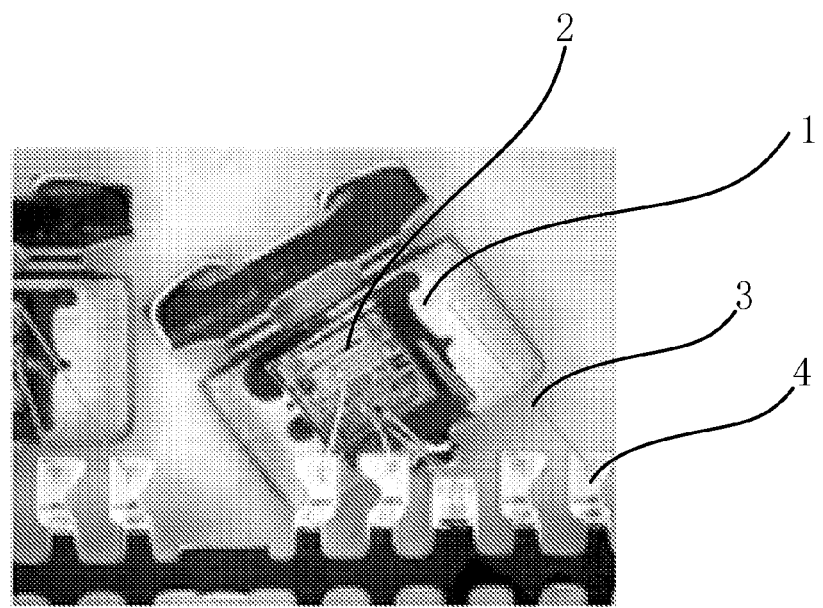
FIG. 1 shows a microscope photo of a lead frame with a die attached thereon and wire bonded thereto.
Figure 2:
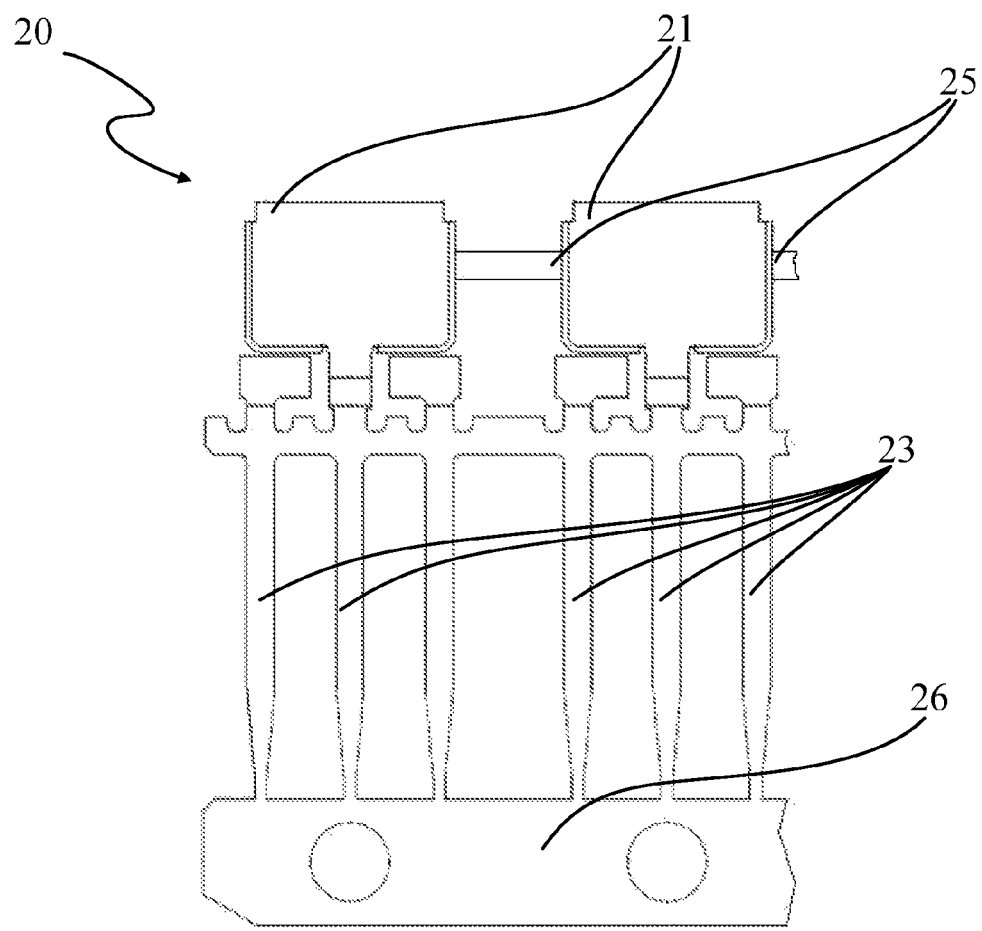
FIG. 2 shows a partial plan view of an embodiment of the lead frame according to one aspect of the invention.

In one embodiment of the lead frame according to the invention, referred to as 20, the lead frame 20 comprises a first plurality of die pads for mounting dice thereon (the process of mounting and packaging will be described in the), a second plurality of leads extending from the first plurality of die pads, and a third plurality of tie elements, each of which connects one of the first plurality of die pads to another. FIG. 2 is a partial plan view of the lead frame 20 and there are shown two die pads 21, six leads 23 and one complete tie element 25 connecting the two die pads 21. As understood by the skilled in the art, the lead frame 20 can have a repeating, one-dimensional or two-dimensional pattern of the unit of FIG. 2.

The lead frame 20 has an improved mechanical stability. Accidental external forces may be exerted on one die pad 21 during, for example, transferring the lead frame 20 from one apparatus to another, such forces can be imparted to its adjacent die pads, since the die pad 21 is connected to its adjacent die pads by tie elements 25. In this way, the die pad 21 is less prone to external forces.

The lead frame 20 also has decreased thermal contraction and curvature as a result of the tie elements 25. In a contraction rate test, conventional lead frames have shown an average contraction rate of about 40 ppm, and lead frames 20 haven't shown any contraction. In a curvature test, conventional lead frames have shown an average curvature of about 200 ppm, and lead frames 20 haven't shown any curvature. In a resin spill test, packages using conventional lead frames have shown an average resin spill of about 540 ppm, and packages using lead frames 20 have shown a reduced resin spill of about 120 ppm.

The lead frame 20 can be made from copper, nickel alloy or any other suitable materials and can be formed using industry standard methods of making lead frames, such as stamping and etching, or any other suitable methods. In one example, the lead frame 20 is formed by stamping. To be specific, in one or more punching steps, materials are removed from a metal sheet to define the plurality of die pads 21 interconnected by the plurality of tie elements 25, and the plurality of die pads 21 may remain integral with the plurality of tie elements 25. It is also feasible to form the plurality of leads 23 together with the plurality of die pads 21 and the plurality of tie elements 25. In another example, the lead frame 20 is formed by etching. To be specific, a metal sheet is selectively covered with photoresist in accordance with the intended pattern shown in FIG. 2 and then exposed to chemical etchants that remove areas not covered by photoresist. As a result, the plurality of die pads 21, the plurality of leads 23 and the plurality of tie elements 25 are integrally formed.

It should be noted that the lead frames described herein are not limited to the configuration shown in FIG. 2. Each of the plurality of die pads 21 may correspond to two, four, five or seven leads 23 according to the type of transistors, integrated circuits or other devices to be packaged. Moreover, the plurality of tie elements 25 may take various shapes, for example, strip, polygon and so on.

Still referring to FIG. 2, optionally, the lead frame 20 further comprises a strip element 26 connected to the second plurality of leads 23 so as to facilitate performing operations on the lead frame 20.

Figure 3:
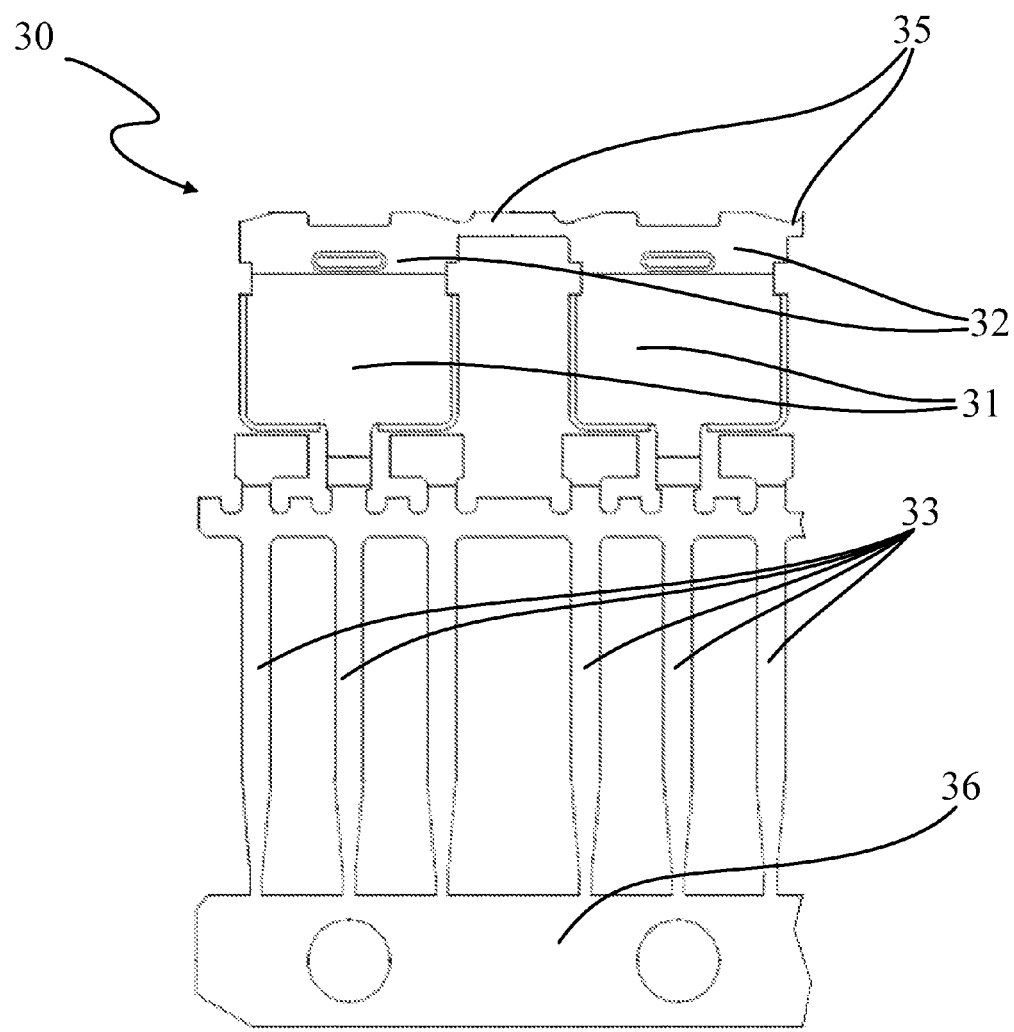
FIG. 3 shows a partial plan view of another embodiment of the lead frame according to one aspect of the invention.

FIG. 3 shows a partial plan view of another embodiment of the lead frame according to one aspect of the invention. The lead frame 30 comprises a first plurality of die pads 31 for mounting dice thereon, a second plurality of leads 33 extending from the first plurality of die pads 31, and a third plurality of tie elements 35, each of which connects one of the first plurality of die pads 31 to another. The lead frame 30 is different from the lead frame 20 in that each of the die pads 31 comprises a tab portion 32 at an end opposite the second plurality of leads 33, which can be made of metal and mounted to a heat sink. The tie elements 35 connects one die pad 31 to another at respective tab portions 32.

The lead frame 30 has an improved mechanical stability. Accidental external forces may be exerted on one die pad 31 during, for example, transferring the lead frame 30 from one apparatus to another, such forces can be imparted to its adjacent die pads, since the die pad 31 is connected to its adjacent die pads by tie elements 35. In this way, the die pad 31 is less prone to external forces.

The lead frame 30 also has decreased thermal contraction and curvature as a result of the tie elements 35. In a contraction rate test, conventional lead frames have shown an average contraction rate of about 40 ppm, and lead frames 30 haven't shown any contraction. In a curvature test, conventional lead frames have shown an average curvature of about 200 ppm, and lead frames 30 haven't shown any curvature. In a resin spill test, packages using conventional lead frames have shown an average resin spill of about 540 ppm, and packages using lead frames 30 have shown a reduced resin spill of about 120 ppm.

The lead frame 30 can be made from copper, nickel alloy or any other suitable materials and can be formed using industry standard methods of making lead frames, such as stamping and etching, or any other suitable methods. In one example, the lead frame 30 is formed by stamping. To be specific, in one or more punching steps, materials are removed from a metal sheet to define the plurality of die pads 31 interconnected by the plurality of tie elements 35, and the plurality of die pads 31 may remain integral with the plurality of tie elements 35. It is also feasible to form the plurality of leads 33 together with the plurality of die pads 31 and the plurality of tie elements 35. In another example, the lead frame 30 is formed by etching. To be specific, a metal sheet is selectively covered with photoresist in accordance with the intended pattern shown in FIG. 3 and then exposed to chemical etchants that remove areas not covered by photoresist. As a result, the plurality of die pads 31, the plurality of leads 33 and the plurality of tie elements 35 are integrally formed.

It should be noted that the lead frames described herein are not limited to the configuration shown in FIG. 3. Each of the plurality of die pads 31 may correspond to two, four, five or seven leads 33 according to the type of transistors, integrated circuits or other devices to be packaged. Moreover, the plurality of tie elements 35 may take various shapes, for example, strip, polygon and so on.

Still referring to FIG. 3, optionally, the lead frame 30 further comprises a strip element 36 connected to the second plurality of leads 33 so as to facilitate performing operations on the lead frame 30.

Figure 4:
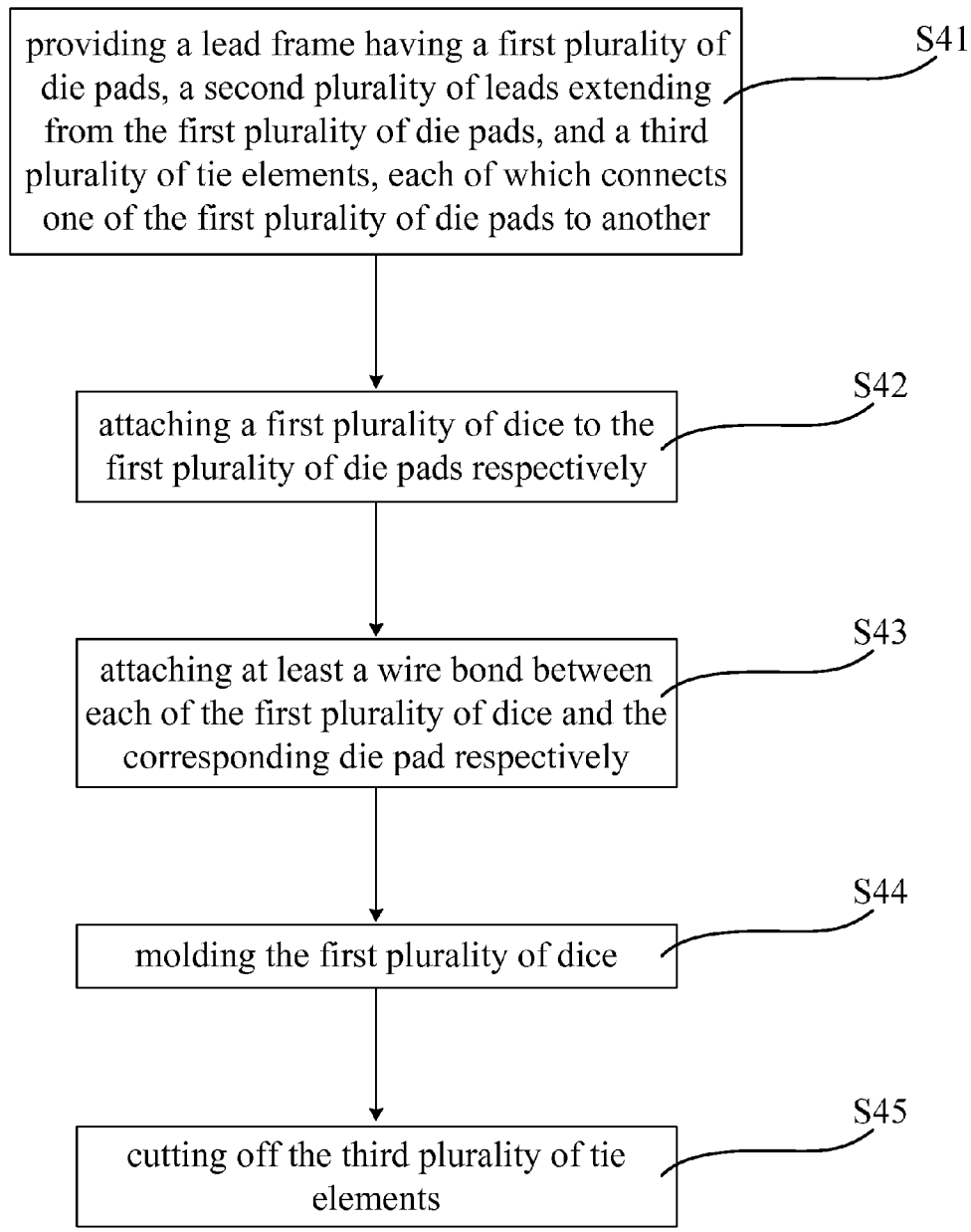
FIG. 4 shows a flow diagram of an embodiment of the method according to another aspect of the invention.

FIG. 4 shows a flow diagram of an embodiment of the method according to another aspect of the invention. Steps of the method will be described with reference to the lead frame 20.

In step S41, lead frame 20 is provided.

In step S42, a first plurality of dice are attached to the first plurality of die pads 21 of the lead frame 20 by means of solder paste, soft solder, or a silver paste filled epoxy, which is first applied to the die pads 21 before the dice are attached, followed by a solder reflow process or an epoxy curing process.

In step S43, wires, which may be aluminum or gold, are bonded at one end to the first plurality of dice and at the other end to the first plurality of die pads 21, so that electrical connections therebetween are formed.

In step S44, the first plurality of dice are molded with encapsulation materials such as resin and plastic.

In step S45, the third plurality of tie elements 25 are cut off, and the molded dice are singulated and trimmed.

In the disclosure herein, operations of product embodiment(s) may be described with reference to method embodiment(s) for illustrative purposes. However, it should be appreciated that the operations of the products and the implementations of the methods in the disclosure may be independent of one another. That is, the disclosed product embodiments may operate according to other methods and the disclosed method embodiments may be implemented through other products.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacturing, compositions of matter, means, methods, or steps.

What is claimed is:

1. A lead frame, comprising:
   a first plurality of die pads;
   a second plurality of leads extending from the first plurality of die pads;
   a third plurality of tie elements, each of which connects one die pad of the first plurality of die pads to another die pad of the first plurality of die pads; and
   a strip element connected to the second plurality of leads;

wherein each of the first plurality of die pads comprises a tab portion at an end opposite the second plurality of leads;

wherein each of the third plurality of tie elements connects one die pad to another at respective tab portions.

2. The lead frame of claim 1, wherein each of the third plurality of tie elements connects two adjacent die pads.

3. The lead frame of claim 1, wherein each of the third plurality of tie elements is integral with the two die pads connected thereto.

4. A lead frame for discrete package, comprising the lead frame of any of claim 1.

5. The lead frame of claim 1, wherein at least one tie element of the third plurality of tie elements is shaped as a strip.

6. The lead frame of claim 1, wherein at least one tie element of the third plurality of tie elements is shaped as a polygon.

7. The lead frame of claim 1, wherein the first plurality of die pads, the second plurality of leads and the third plurality of tie elements are integrally formed.

8. A method, comprising:
   forming a lead frame having:
      a first plurality of die pads,
      a second plurality of leads extending from the first plurality of die pads,
      a third plurality of tie elements, each of which connects one of the first plurality of die pads to another, and
      a strip element connected to the second plurality of leads;
   attaching a first plurality of dice to the first plurality of die pads respectively;
   attaching at least a wire bond between each of the first plurality of dice and the corresponding die pad respectively;
   molding the first plurality of dice; and
   cutting off the third plurality of tie elements;
   wherein each of the first plurality of die pads comprises a tab portion at an end opposite the second plurality of leads;
   wherein each of the third plurality of tie elements connects a die pad from the first plurality of die pads to another die pad from the first plurality of die pads at respective tab portions.

9. The method of claim 8, wherein the first plurality of dice are molded with encapsulation material.

10. The method of claim 8, wherein the encapsulation material comprises resin or plastic.

11. The method of claim 8, wherein the strip element facilitates performing operations on the lead frame.

12. A lead frame, comprising:
   a plurality of die pads;
   a plurality of leads extending from the first plurality of die pads;
   a plurality of tie elements, wherein at least one tie element of the plurality of tie elements connects a die pad of the plurality of die pads to another die pad of the plurality of die pads; and
   a strip element connected to the plurality of leads;
   wherein each of the plurality of die pads comprises a tab portion at an end opposite the plurality of leads;
   wherein each of the plurality of tie elements connects a die pad from the plurality of die pads to another die pad from the plurality of die pads at respective tab portions.

* * * * *